United States Patent
Gao et al.

(10) Patent No.: US 7,433,811 B2
(45) Date of Patent: Oct. 7, 2008

(54) DIRECT PATTERNING OF SILICON BY PHOTOELECTROCHEMICAL ETCHING

(75) Inventors: Jun Gao, Kingston (CA); Michael J. Sailor, La Jolla, CA (US); Sangeeta Bhatia, La Jolla, CA (US); Christopher Flaim, Modesto, CA (US)

(73) Assignee: The Regents of the University of California, Oakland, CA (US)

( * ) Notice: Subject to any disclaimer, the term of this patent is extended or adjusted under 35 U.S.C. 154(b) by 340 days.

(21) Appl. No.: 10/838,859

(22) Filed: May 4, 2004

(65) Prior Publication Data

US 2005/0009374 A1    Jan. 13, 2005

Related U.S. Application Data

(60) Provisional application No. 60/468,346, filed on May 6, 2003.

(51) Int. Cl.
G06F 17/50 (2006.01)
C23C 20/00 (2006.01)
(52) U.S. Cl. .............................. 703/12; 716/21; 205/67
(58) Field of Classification Search .................. 716/21; 205/655, 91, 67; 438/305, 695; 703/2, 12; 435/366
See application file for complete search history.

(56) References Cited

U.S. PATENT DOCUMENTS

| | | | | |
|---|---|---|---|---|
| 5,318,676 A * | 6/1994 | Sailor et al. | ................. | 205/655 |
| 5,427,648 A * | 6/1995 | Pamulapati et al. | ............ | 216/24 |
| 5,512,162 A * | 4/1996 | Sachs et al. | .................... | 205/91 |
| 6,027,630 A * | 2/2000 | Cohen | ......................... | 205/135 |
| 6,034,001 A * | 3/2000 | Shor et al. | .................. | 438/695 |
| 2002/0072116 A1 * | 6/2002 | Bhatia et al. | ................. | 435/366 |
| 2003/0170959 A1 * | 9/2003 | Salafsky | ..................... | 438/305 |

OTHER PUBLICATIONS

Xia, Y.; Rogers, J. A.; Paul, K.E.; Whitesides, G.M., "Unconventional Methods For Fabricating And Patterning Nanostructures", *Chem. Rev.*, vol. 99, 1823-48 (1999).

Snow, E. S.; Campbell, P. M.; Perkins, F. K., "Nanofabrication With Proximal Probes", *Proceedings of the IEEE*, vol. 85, No. 4, 601-611 (Apr. 1997).

Xia, Y.; Whitesides, G. M., "Soft Lithography", *Annu. Rev. Mater. Sci.*, vol. 28, 153-184 (1998).

Doan, V. V.; Sailor, M. J., "Luminescent Color Image Generation on Porous Silicon", *Science*, vol. 256, No. 5065, 1791-92 (Jun. 16, 1992).

(Continued)

*Primary Examiner*—Thai Phan
(74) *Attorney, Agent, or Firm*—Greer, Burns & Crain, Ltd.

(57) ABSTRACT

The invention is directed to methods for direct patterning of silicon. The invention provides the ability to fabricate complex surfaces in silicon with three dimensional features of high resolution and complex detail. The invention is suitable, for example, for use in soft lithography as embodiments of the invention can quickly create a master for use in soft lithography. In an embodiment of the invention, electrochemical etching of silicon, such as a silicon wafer, for example, is conducted while at least a portion of the silicon surface is exposed to an optical pattern. The etching creates porous silicon in the substrate, and removal of the porous silicon layer leaves a three-dimensional structure correlating to the optical pattern.

28 Claims, 1 Drawing Sheet

OTHER PUBLICATIONS

Doan, V.V.; Sailor, M., "Photolithographic Fabrication of Micron-Dimension Porous Si Structures Exhibiting Visible Luminescence", *J. Appl. Phys. Lett.*, 60, 619-620 (Feb. 3, 1992).

Lehmann, V.; Föll, H., "Formation Mechanism and Properties of Electrochemically Etched Trenches in n-Type Silicon", *J. Electrochem. Soc.*, vol. 137, No. 2, pp. 653-659 (Feb. 1990).

Lévy-Clement, C.; Lagoubi, A.; Tomkiewicz, M. *J.*, "Morphology of Porous n-Type Silicon Obtained by Photoelectrochemical Etching", *J. Electrochem. Soc.*, vol. 141, No. 4, pp. 958-967 (Apr. 1994).

Van Rijsewijk, H.C.H.; Legierse, P.E.J.; Thomas, G.E., "Manufacture of LaserVision Video Discs by a Photopolymerization Process", *Philips Tech.*, vol. 40, 287-297 (1982).

\* cited by examiner

DIRECT PATTERNING OF SILICON BY PHOTOELECTROCHEMICAL ETCHING

PRIORITY CLAIM

Applicants claim priority benefits under 35 U.S.C. § 119 on the basis of patent application Ser. No. 60/468,346, filed May 6, 2003.

STATEMENT OF GOVERNMENT INTEREST

The invention was made with Government assistance under Space and Naval War Systems Grant No. N6001-98-C-8514. The Government has certain rights in this invention.

FIELD OF THE INVENTION

The invention relates to the field of resistless optical lithography on silicon. The invention enables large-area, variable-depth images or patterns to be etched, in a single step, onto a silicon wafer with micrometer resolution. The invention is suitable, for example, for rapid prototyping of masters for use in soft lithography. A wide array of fields, such as sensors, microfluidics, microanalysis, microelectromechanical systems (MEMS) and cell biology might benefit from this invention.

BACKGROUND

Patterning of semiconductor wafers is usually carried out using photoresist masks patterned using UV light, electron beams or X-rays. There is recent interest in newer techniques for fabricating micro- or nanostructures. Many of the new techniques do not involve the use of a photoresist and related chemicals, which is advantageous because of improved cleanliness and reduced processing time.

Proximal probe-based lithography is a resistless lithography technique that can generate very high resolution (even down to the single-atom level), but like other such techniques is a serial process. This makes the process generally suitable for small areas, since the series write process is time-consuming.

Soft lithography is a resistless technique that provides for parallel writing. It therefore offers many advantages over photolithography and other microfabrication techniques especially in the patterning of nonplanar substrates and unusual materials. Almost all soft lithography techniques, such as microcontact printing (μCP), replica molding (REM) and micromolding in capillaries (MIMIC) start from a rigid master against which an elastomeric stamp or mold is prepared by cast molding. The master is fabricated using conventional microlithographic techniques such as photolithography, micromachining or e-beam writing. Typically a master is made from a crystalline Si substrate, which sets certain limitations on the dimensions and morphology of the pattern. For instance, molds that contain several different feature heights require multiple applications of lithography and precise mask alignment between steps. In addition, an isotropic KOH etch of crystalline Si limits the angles of etch to be either 90° or 54.74° made by the intersection of the (100) and (111) faces of silicon.

A prior patent related to this work is U.S. Pat. No. 5,318,676. That patent concerned the transfer of projected images into a silicon substrate. The images remained in the substrate and are useful, for example, for optical data storage and emissive circuits requiring a variety of emission wavelengths. The present invention extends the work in the '676 patent to create free-standing three-dimensional patterns of generally arbitrary complexity in silicon.

SUMMARY OF THE INVENTION

The invention is directed to methods for direct patterning of silicon. The invention provides the ability to fabricate complex surfaces in silicon with three-dimensional features of high resolution and complex detail. The invention is suitable, for example, for use in soft lithography as embodiments of the invention can quickly create a master for use in soft lithography. In an embodiment of the invention, electrochemical etching of silicon, such as a silicon wafer, for example, is conducted while at least a portion of the silicon surface is exposed to an optical pattern. The etching creates porous silicon in the substrate, and removal of the porous silicon layer leaves a three-dimensional structure correlating to the optical pattern.

BEST MODE FOR CARRYING OUT THE INVENTION

Figure 1:
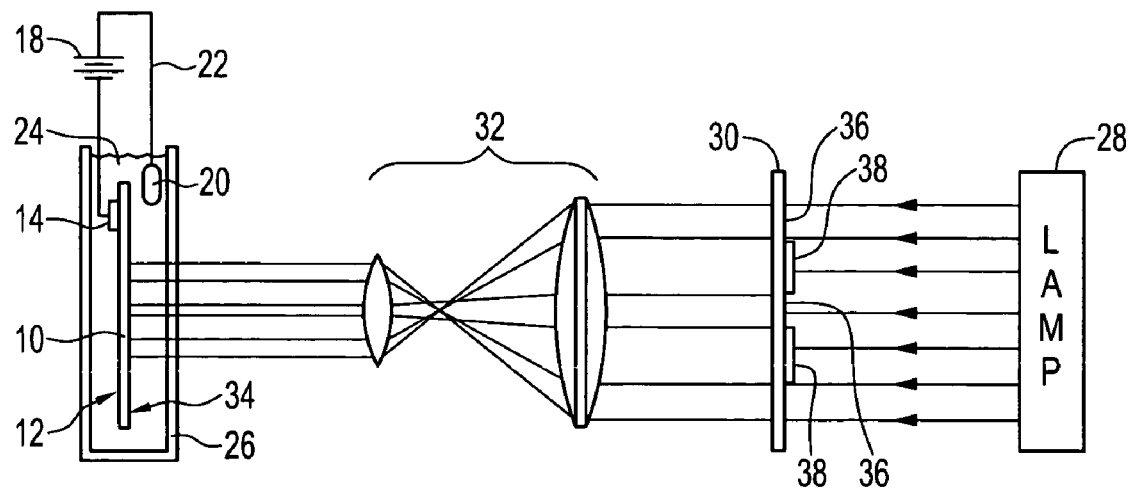
FIG. 1 is a schematic diagram of a system for performing a method of the invention.

The invention is directed to methods for direct patterning of silicon. The invention provides the ability to fabricate complex surfaces in silicon with three-dimensional features of high resolution and complex detail. The invention is suitable, for example, for use in soft lithography as embodiments of the invention can quickly create a master for use in soft lithography.

In an embodiment of the invention for directly generating a three-dimensional pattern, a substrate having a silicon surface is selected. A first electrical conductor is affixed to the substrate for carrying a first charge to a backside of the substrate. A second electrical conductor for carrying a second charge opposite the first charge is selected, and immersed into a hydrofluoric acid-containing solution along with the substrate. An image is projected onto the silicon surface while current is applied to the first conductor and the second conductor to obtain an appropriate charge density. Afterwards, the substrate is removed from the solution. A porous layer is partially or completely removed from the substrate by contact to a base solution or by another chemical dissolution process (such as thermal oxidation followed by treatment with aqueous HF) to leave a three-dimensional pattern having a correspondence to the image projected onto the surface.

In an embodiment of the invention for integrating an optical element into a silicon wafer, a single-crystal silicon wafer is selected. The wafer is placed in an optically transmissive container or a container including an optically-transmissive window. The intensity of an exposure light is modulated by projecting the exposure light through a patterned mask onto at least a portion of the wafer. The wafer is electrochemically etched in an HF-containing solution. The etch rate varies in correspondence to the intensity of exposure light. The wafer is exposed to a base solution to remove porous material from a pattern in the silicon wafer that correlates with the patterned mask.

In an embodiment of the invention for patterning a silicon substrate, the substrate is immersed in an etchant solution. An etching current density is created on a surface of the substrate while simultaneously projecting at least one optical pattern onto at least a portion of the surface of the silicon substrate. The substrate is separated from the etchant solution. A surface of the substrate is exposed to a base solution to remove a porous layer and leave a three-dimensional pattern corresponding to the optical pattern.

In an embodiment of the invention for patterning a silicon substrate, the substrate is etched while at least a portion of a surface of the substrate is exposed to an optical pattern to form a three-dimensional pattern in the substrate covered in a porous layer. The porous layer is then removed.

In an embodiment of the invention for resistless projection lithography for generating three-dimensional patterns on silicon substrates, at least one image is projected onto at least one portion of a surface of a silicon substrate while conducting electrochemical etching of the surface. A porous layer formed during the electrochemical etching is dipped into a base solution. Alternatively, the porous layer can be removed by mild thermal oxidation of the porous layer followed by dissolution of the porous silicon oxide layer by the action of hydrofluoric acid.

The invention is principally based upon a selective formation of a porous silicon layer. The invention provides variable feature depths and angles in a single resist-free photoelectrochemical (PEC) etch. The thickness, porosity and morphology of a porous silicon layer are affected by many factors, including etch current density, etch time, etchant composition, substrate resistivity and orientation. Importantly to the invention, illumination also plays an important role in porous silicon formation. Illumination creates an especially strong effect for n-type silicon substrates with low dopant concentrations, as light absorption generates electrons and holes, but the invention is also effective for n-type substrates with higher doping levels and for p-type substrates. The invention may create complex patterns, as we have demonstrated by patterning a silicon substrate with complex images during etching. Some particular preferred embodiments will now be discussed in detail, and various additional inventive features will be apparent to artisans.

Referring now to FIG. 1, a silicon substrate 10, such as a silicon wafer or some portion thereof is ohmically contacted on its backside 12 by an electrode 14 in a two-electrode electrochemical cell. The electrode 14, for example, may be connected to a power source 18 by a copper wire. Another electrode 20, e.g., a loop of platinum wire, mesh, or sheet, is attached to a conductor 22, e.g., a platinum wire, and is a counter-electrode in the system. An etching solution 24, e.g., 50:50 (by volume) of aqueous HF and ethanol is disposed in an optically transmissive container 26, or one having an optically transmissive window. A high intensity lamp 28 illuminates a mask 30, containing a pattern to be projected so that the image is projected through reducing optics 32 onto a surface 34 of the substrate 10. The light modulated by mask 30 determines the areas on the substrate 10 that will be etched to produce porous silicon, and also can vary the rate in local areas if the mask 30 passes light of different intensity. If the substrate 10 is n-type, areas corresponding to completely or partially transmissive areas 36 of the mask 30 will become porous silicon. For a p-type substrate, areas corresponding to non-transmissive portions 38 of mask 30 will preferentially become porous silicon.

After etching, the substrate 10 is removed from the etching solution, and prepared for removal of the porous silicon. For example, the substrate 10 may be rinsed with ethanol and air-dried. The formed porous silicon is then removed by exposing the porous silicon to a base solution. After the porous silicon is removed, the surface 34 exhibits a three-dimensional pattern corresponding to the pattern embodied in the mask 30.

Figure 2:
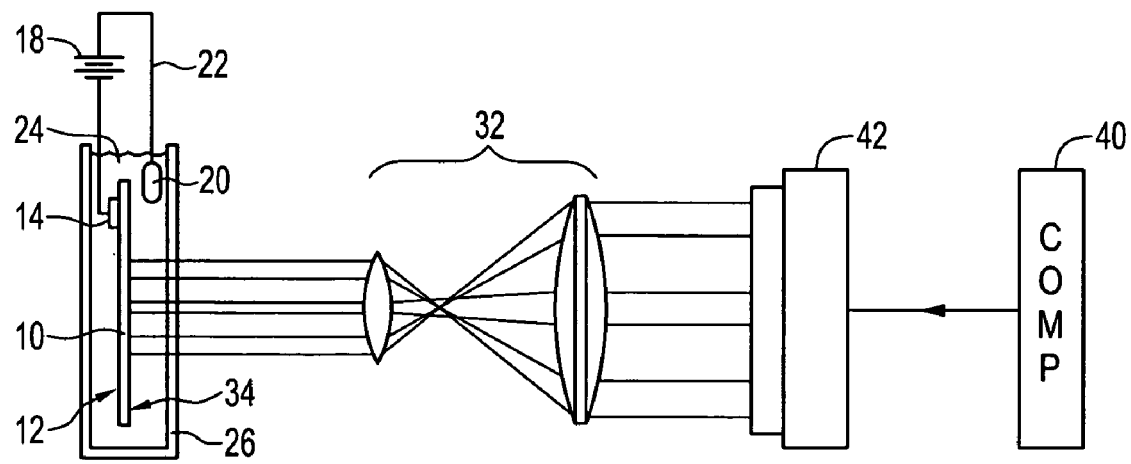
FIG. 2 is a schematic diagram of another system for performing a method of the invention.

Another system is shown in FIG. 2. Parts of the FIG. 2 system that are the same as FIG. 1 are labeled with like reference numerals. In the system of FIG. 2, a computer 40 and projector 42 replace the lamp 28 and the mask 30. A pattern, for example a complex image, is generated by the computer 40 and displayed by the projector. Etching occurs on the surface 34 in accordance with the exposure of the pattern from the projector. After contact with a base solution, the surface 34 exhibits a three-dimensional pattern.

Various experiments have been conducted by us to demonstrate the invention. A discussion that follows explains the experiments. Artisans will appreciate that the example experiments do not limit the invention in its broader aspects, and will also glean additional inventive features in the following discussion. Additional preferred embodiments are evident in the following discussion.

In an experiment, a silicon wafer was patterned by the optical etching process described above in a HF-resistant Teflon etch cell configured with an optical window in front of the wafer and a platinum counter electrode. The wafer was a 4-inch wafer (Siltronix, n-type, 5~10 ohm-cm resistivity) immersed in an electrolyte consisting of a 1:1 mixture of ethanol and 48% aqueous HF. A potentiostat was used to apply a voltage between the Si working electrode and the counter electrode and to maintain a constant current density of $0.1$ $mA/cm^2$.

Electrical contacts to the silicon wafer were made by attaching six alligator clips to the rim of the wafer. During the etch, an optical image or pattern, generated by a computer, was projected on to the silicon substrate through the window and electrolyte solution. A Proxima 2810 (640×480 resolution) projector and a reducing lens were used to for image projection. The maximum white light intensity at the wafer surface is about 5 $mW/cm^2$. The variation in light intensity across the image results in a spatially varying photocurrent that modulates the local etching rate, transferring the pattern to the wafer as an inhomogeneous porous Si layer. The porous layer is then removed after prolonged etching by dissolving in a base solution, typically 1 M NaOH in a water solution. Example base solutions include NaOH, KOH, or $NH_3$ in water.

The silicon skeleton left on the substrate generates a black and white image or pattern similar to the projected image or pattern. We have demonstrated this with images, such as the picture of a person. For an etch time of no more than 3 hours, a positive image is generated with areas more strongly illuminated (exposed) appearing more whitish. The image contrast is the result of the surface morphology variation caused by different degrees of light illumination during photo electrochemical etching (PEC). It appears to the naked eye that the more exposed areas are rougher than the less exposed areas. SEM micrographs have confirmed this observation.

Other samples were prepared with a multitude of random complex and simple patterns. A sample was made by projecting a pattern with a gradient in shades so that the effect of illumination could be studied. It was obvious that the most illuminated region is the roughest, even before the base treatment. The removal of the top porous layer reveals a surface filled with rounded etch craters and pits dimensioned in accordance with the pattern. The very rough surface scatters light in a great degree and appears whitish for strongly illuminated areas. The less illuminated areas, on the other hand, are smoother and scatter less light. Contrast and images are therefore achieved as a result of the variation in morphology and the ability in scattering light.

Both the exposure light source and the excitation light source can cover a wide range of wavelengths from infrared to ultraviolet, including white light. The wavelength of the exposure light may be selected according to the desired resolution quality. Shorter wavelengths (UV) provide better resolution, as is generally known in photolithography, while IR radiation provides deeper penetration into the silicon, which may degrade resolution.

The resistivity of both the n- and p-type silicon is not critical, and the effect can be generated in silicon ranging from near intrinsic to doping levels just below that where metallic behavior occurs.

The form of the silicon is not limited to single-crystal silicon wafers. Amorphous silicon should also be acceptable for formation of patterned porous silicon. In some situations, it may be preferable to utilize silicon on sapphire (SOS) or some other form of silicon on an insulating substrate to limit etch depth.

Single-crystal silicon electrodes immersed in HF etching solutions display rectification properties analogous to Schottky barriers. The anodic current necessary for porous silicon formation corresponds to the forward-bias current for p-type silicon, and the reverse-bias current for n-type silicon electrodes. Since the reverse-bias current at n-type silicon is limited by the junction barrier to a small value, anodic corrosion does not occur at n-type silicon unless the electrode surface is illuminated. The illumination generates electron-hole pairs that are separated by the electrostatic barrier of the silicon/electrolyte interface. For n-type silicon, holes migrate to the surface and increase the rate of corrosion. Correspondingly, illumination of p-type silicon inhibits corrosion.

In an n-type silicon sample, the regions that are not illuminated during etch display no evidence of porous silicon formation, while those that are illuminated show the characteristic porous silicon surface. In contrast, illumination of p-type silicon electrodes result in photo-cathodic protection, and patterns projected onto p-type silicon generate negative images of porous silicon.

The morphology of photoelectrochemically (PEC) etched n-type silicon is affected by many etching and material parameters such as anodization time, photocurrent (illumination), dopant density, crystal orientation, and so on. A low current density, e.g., 0.1-0.5 mA/cm$^2$ was found to work best to preserve high resolution images.

In experiments involving the etching of a large (4") silicon wafer, where the electrical contact was made by simply attaching alligator clips to the rim of the wafer, higher etching currents sometimes cause the silicon wafer to break due to stress induced by uneven current flow and local heating. The alligator clips, however, do have an advantage because they can be easily removed or rearranged to adjust the photocurrent distribution and therefore the local "exposure" of the wafer. Extended etching will cause "overexposure" of some highly illuminated areas, which will turn black and cause the contrast of the image to decrease. The change in appearance is due to the deepening of the etch pits to give a honeycomb-like surface that absorbs light strongly instead of scattering light.

After PEC etch and the removal of the top porous silicon layer, the depth of areas with different illumination level will vary because of the difference in the top porous silicon layer thickness. This allows three-dimensional silicon structures with variable depth to be fabricated by a single PEC etch. Experiments with different patterns and profilometry measurements revealed a maximum depth variation at about 1 mm between illuminated and nonilluminated regions. Poly dimethylsiloxane (PDMS) stamps could be prepared by casting of the polymer precursor into these 3D patterns.

Previous experiments have also demonstrated the various types of patterns that may be transferred into the silicon substrate by PEC etching. Single-crystal polished (100) wafers of phosphorous-doped (n-type) silicon of 0.95 ohm-cm resistivity and boron-doped (p-type) silicon of 0.36 ohm-cm resistivity were cut into rectangles with areas of approximately 0.3 cm$^2$. Ohmic contacts were generated on the back by scratching with Ga—In eutectic and affixing a copper wire with silver print. The contact and the edges of the silicon were coated with epoxy for use as the working electrode. The counterelectrode was a platinum flag with a press-contacted platinum wire attached. The etching bath was a 50:50 (by volume) solution of aqueous 49% HF and 95% ethanol. The projection lamp was a 300 watt ELH-type tungsten lamp filtered through interference filters with 20 nm bandpass. Luminescent porous silicon resulted after etching at approximate current densities of 0.5 mA/cm$^2$ until a total of approximately 1.0 (for n-type Si) or 10.0 (for p-type Si) coulombs/cm$^2$ had been passed. The samples were then removed from the bath, rinsed with ethanol and air-dried. Illumination with a small UV lamp resulted in visible luminescence. These experimental structures were not exposed to a base solution, but exposure to the base solution would remove the porous silicon to reveal a three-dimensional pattern.

The fabrication of complex, multilevel structure is extremely important for applications such as microelectronic, microelectromechanical systems (MEMS), microanalytical systems and so on. Traditionally this is done by multiple applications of photolithography that is time consuming and requires high precision in alignment. The resistless projection lithographic technique demonstrated here may accomplish this task with a single PEC etch. This technique can be used for fast prototyping rigid masters that can be used in soft lithography.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for directly generating a three-dimensional pattern, the method comprising steps of:
   selecting a substrate having a silicon surface;
   affixing a first electrical conductor for carrying a first charge to a backside of said substrate;
   selecting a second electrical conductor for carrying a second charge opposite of said first charge;
   immersing said substrate and said second electrical conductor into a hydrofluoric acid-containing solution;
   projecting an image onto said silicon surface;
   applying a current to said first conductor and said second conductor until an appropriate charge density is attained;
   removing said substrate from said hydrofluoric acid containing solution; and
   dissolving a porous layer from the substrate by contact to a chemical dissolution solution to leave a three-dimensional pattern having a correspondence to the image projected in said step of projecting.

2. A method as in claim 1 wherein the step of selecting said substrate comprises selecting doped single-crystal silicon.

3. A method as in claim 2 wherein said silicon is n-type.

4. A method as in claim 3 wherein said appropriate charge density is approximately 1.0 coulomb/$cm^2$.

5. A method as in claim 2 wherein said silicon is p-type.

6. A method as in claim 5 wherein said appropriate charge density is approximately 10 coulombs/$cm^2$.

7. A method as in claim 1 wherein the step of selecting said substrate comprises selecting an insulating substrate upon which a layer of silicon is formed.

8. A method as in claim 1 wherein said chemical dissolution solution comprises a hydrofluoric acid-containing solution further containing ethanol.

9. A method as in claim 1 wherein the step of projecting an image comprises:
selecting an exposure source according to a desired level of resolution of said image.

10. A method as in claim 1 wherein the step of projecting an image comprises projecting an exposure light through a high contrast pattern.

11. A method as in claim 1 wherein the step of projecting an image comprises projecting an exposure light through a poly-contrast or gray scale image.

12. A method as in claim 1 wherein the step of projecting an image comprises projecting an exposure light through a one- or two dimensional grating to produce a plurality of interference fringes.

13. A method for integrating optical elements on a silicon wafer, the method comprising steps of:
selecting a single-crystal silicon wafer;
placing said silicon wafer in an optically transmissive container or a container including an optically-transmissive window;
modulating intensity of an exposure light by projecting said exposure light through a patterned mask onto at least a portion of said silicon wafer;
electrochemically etching said silicon wafer in an HF-containing solution wherein an etch rate corresponds to said intensity of exposure light; and
exposing said silicon wafer to a chemical dissolution solution to remove porous material from a pattern in the silicon wafer that correlates with the patterned mask.

14. A method as in claim 13 wherein the step of selecting said silicon wafer comprises selecting n-type silicon wherein said at least one area corresponds to a positive image of said patterned mask.

15. A method as in claim 13 wherein the step of selecting said silicon wafer comprises selecting p-type silicon wherein said at least one area corresponds to a negative image of said patterned mask.

16. A method as in claim 13 wherein the step of electrochemically etching comprises selecting an HF-containing solution further containing ethanol.

17. A method as in claim 13 wherein said patterned mask comprises a high-contrast image.

18. A method as in claim 13 wherein said patterned mask comprises a poly-contrast or gray scale image.

19. A method as in claim 13 wherein said patterned mask comprises a plurality of interference fringes.

20. A method as in claim 13 wherein the step of electrochemically etching said silicon wafer is terminated upon achieving an appropriate charge density.

21. A method as in claim 20 wherein said appropriate charge density is 1 coulomb/$cm^2$ for n-type silicon.

22. A method as in claim 20 wherein said appropriate charge density is 10 coulombs/$cm^2$ for p-type silicon.

23. A method for patterning a silicon substrate, the method comprising steps of:
immersing a silicon substrate in an etchant solution;
creating an etching current density on a surface of the silicon substrate while simultaneously projecting at least one optical pattern onto at least a portion of the surface of the silicon substrate;
separating the silicon substrate from the etchant solution; and
exposing the surface of the silicon substrate to a chemical dissolution solution to remove a porous layer and leave a three-dimensional pattern corresponding to the optical pattern.

24. The method as in claim 23, wherein the etching current density is approximately 0.1 mA/$cm^2$.

25. The method as in claim 23, further comprising a step of adjusting current distribution on the surface of the silicon substrate during said step of creating.

26. The method as in claim 23, wherein the chemical dissolution solution comprises 1M NaOH, KOH, or $NH_3$ in $H_2O$.

27. The method as in claim 23, wherein said step of projecting comprises projecting a computer generated image from a computer projector.

28. The method as in claim 23, wherein said step of projecting comprises projecting light through a mask.

* * * * *